United States Patent [19]
Tamaki et al.

[11] Patent Number: 5,369,289
[45] Date of Patent: Nov. 29, 1994

[54] GALLIUM NITRIDE-BASED COMPOUND SEMICONDUCTOR LIGHT-EMITTING DEVICE AND METHOD FOR MAKING THE SAME

[75] Inventors: Makoto Tamaki, Inazawa; Takahiro Kozawa, Owariasahi, both of Japan

[73] Assignees: Toyoda Gosei Co. Ltd., Nishikasugai; Kabushiki Kaisha Toyota Chuo Kenkyusho, Aichi, both of Japan

[21] Appl. No.: 969,769

[22] Filed: Oct. 30, 1992

[30] Foreign Application Priority Data

Oct. 30, 1991 [JP] Japan ................ 3-313977

[51] Int. Cl.$^5$ .................. H01L 29/205; H01L 33/00
[52] U.S. Cl. ........................ 257/99; 257/94; 257/103; 257/749; 257/766
[58] Field of Search ............. 257/94, 101, 99, 102, 257/103, 749, 766

[56] References Cited

U.S. PATENT DOCUMENTS

| | | | |
|---|---|---|---|
| 3,409,809 | 11/1968 | Diehl | 257/766 |
| 3,790,868 | 2/1974 | Soshea | 257/101 |
| 3,849,707 | 11/1974 | Braslau | 257/48 |
| 4,283,118 | 8/1981 | Inoue | 257/766 |
| 4,316,208 | 2/1982 | Kobayashi et al. | 257/99 |
| 4,408,217 | 10/1983 | Kobayashi et al. | 257/103 |
| 4,495,514 | 1/1985 | Lawrence et al. | 257/99 |
| 4,855,249 | 8/1989 | Akasaki et al. | 257/103 |
| 4,911,102 | 3/1990 | Manabe et al. | 257/103 |
| 4,946,548 | 8/1990 | Kotaki et al. | 257/103 |
| 5,122,845 | 6/1992 | Manabe et al. | 257/94 |

*Primary Examiner*—Jerome Jackson
*Attorney, Agent, or Firm*—Cushman, Darby & Cushman

[57] ABSTRACT

A light-emitting device comprises an n-type layer made of an n-type gallium nitride-based compound of the formula $Al_xGa_{1-x}N$, wherein $0 \leq X < 1$, and an i-type layer formed on the n-type layer and made of a semi-insulating i-type gallium nitride-based compound semiconductor and doped with a p-type impurity for junction with the n-type layer. A first electrode is formed on the surface of the i-type layer and made of a transparent conductive film and a second electrode is formed to connect to the n-type layer through the i-type layer. The device is so arranged that light is emitted from the side of the i-type layer to the outside. When an electric current is supplied to the first electrode from a wire contacted thereto, the first electrode is held entirely at a uniform potential. Light is emitted from the entire interface beneath the first electrode and can thus be picked up from the first electrode which is optically transparent.

18 Claims, 9 Drawing Sheets

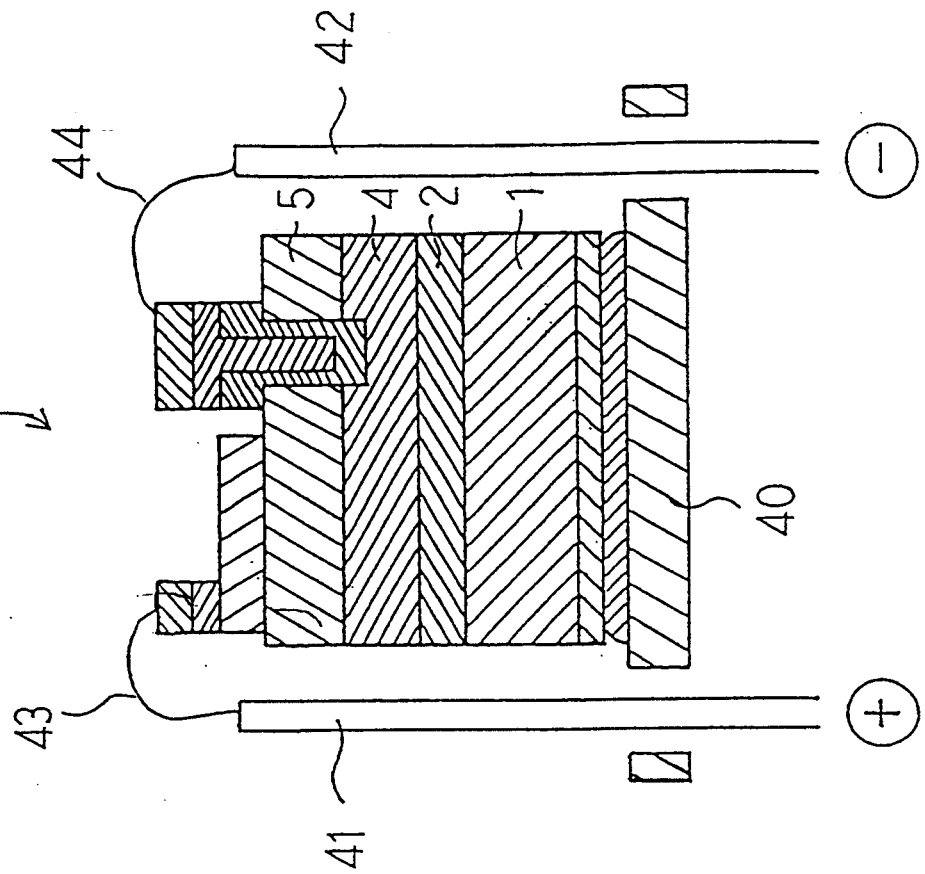
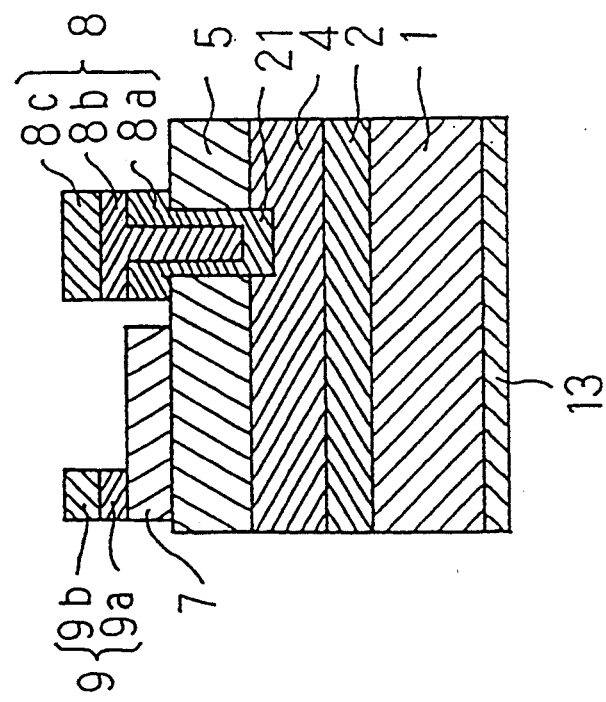

GALLIUM NITRIDE-BASED COMPOUND SEMICONDUCTOR LIGHT-EMITTING DEVICE AND METHOD FOR MAKING THE SAME

BACKGROUND OF THE INVENTION

1. Field of the Invention

This invention relates to a gallium nitride-based compound semiconductor light-emitting device which is able to emit blue light or light in a short wavelength spectral range. The invention also relates to a method for making the device.

2. Description of Related Art

Light-emitting diodes using GaN-based compound semiconductors ($Al_xGa_{1-x}N$ wherein $0 \leq X < 1$) are known as ones which are able to emit blue light or light in a short wavelength spectral range. Attention has been now directed to the GaN-based compound semiconductors because they come in direct transition so that a high light emission efficiency is attained, and are able to emit blue light which is one of the three primary colors.

With such GaN compound semiconductors, low resistance p-type crystals are not obtained. In general, a light-emitting diode using a GaN compound semiconductor is arranged to have a so-called MIS structure which includes a metal electrode, an i-type layer (insulator) made of semi-insulating GaN and an n layer made of n-type GaN. Light emission takes place at a portion beneath the electrode (light emission electrode) on the i-type layer. More particularly, the electrode-forming portion has the MIS structure.

In a GaN blue LED having an MIS structure as mentioned above, it is important that the device structure and the layer arrangement be established firsthand in order to have light emitted efficiently.

In light-emitting devices having a pn junction structure wherein other compound semiconductors of groups III-V, such as $Al_xGa_{1-x}As$ are used, an electric current is diffused transversely along the interface of the junction in the device and, thus, the current passes vertically and uniformly with respect to the interface. As a consequence, unlike an MIS-type LED wherein light is emitted only at a portion beneath the electrode, light is emitted from the entire interface irrespective of the size of the electrode. Because the light is substantially uniformly emitted from the interface, pickup of light is easy.

However, with a GaN blue light LED having an MIS structure, little current diffusion along the transverse direction parallel to the interface takes place in the i-type layer beneath the light-emitting electrode. This results in a light-emitting portion which is limited only to a region beneath the light-emitting electrode. Because the electrode is generally made of a metal, light emission is rarely observed from the side of the light emission electrode as if disappearing behind the electrode.

To avoid this, known GaN blue light LEDs make use of a sapphire substrate and GaN, both of which are transparent to emission light. More particularly, it is customary to utilize a flip-chip system wherein a light emission electrode is provided at the lower side of the substrate or, instead, is provided in a system wherein light is picked up from the back side through the substrate. To this end, a light emission electrode and an electrode electrically connected to an n-type layer (an electrode at the side of the n-type layer) are formed on the surface of a GaN epitaxial layer. These electrodes are bonded with a lead frame by means of a solder, making it possible to pick up light through the substrate.

However, when using the flip-chip system wherein a light emission electrode (i-type layer electrode), an n-type layer electrode and a lead frame are bonded through a solder, the electric series resistance component of the device has to be increased for the following reasons:

(1) Because the distance between the electrodes cannot be made too narrow in order to prevent short-circuiting the light emission electrode (i-type layer electrode, n-type layer electrode and the solder), the electric resistance component becomes large.

(2) If the light emission electrode (i-type layer electrode) and the n-type layer electrode greatly differ in shape under which a solder bump is formed, the solder bumps have inevitably different heights, so that a connection failure with the lead frame will be likely to occur.

Accordingly, it is necessary to shape the electrodes so as to have substantially the same area. This leads to a loss in the degree of design freedom of an electrode pattern, further resulting in difficulty in obtaining an optimum pattern for reducing the electric resistance component. The large electric series resistance component not only lowers the light emission efficiency, but also unfavorably induces generation of heat in the device which causes device operation to degrade and light emission intensity to become lower.

SUMMARY OF THE INVENTION

It is accordingly an object of the invention to provide a light-emitting device which is improved in light pickup efficiency and light emission efficiency while suppressing an electric resistance component to an extent as low as possible.

It is another object of the invention to provide a method for making a light-emitting device of the type mentioned above.

The above object can be achieved, according to the invention, by a gallium nitride-based compound semiconductor light emission device of the type which comprises an n-type layer made of an n-type gallium nitride-based compound semiconductor of the formula $Al_xGa_{1-x}N$ wherein $0 \leq X < 1$, and an i-type layer formed on the n-type layer and made of a gallium nitride-based, semi-insulating gallium nitride-based compound semiconductor of the formula $Al_xGa_{1-x}N$ wherein $0 \leq X < 1$ which is doped with a p-type impurity for junction with the n-type layer.

The device also includes a first electrode formed on one side of the i-type layer and formed of a transparent conductive film, and a second electrode connected to the n-type layer through the i-type layer, light being emitted from the i-type layer to the outside.

In the device of the invention, on the semi-insulating i-type layer, the first electrode made of a transparent conductive film is formed. Light is emitted through the first electrode. The light emission area is defined by the area of the first electrode. The first electrode is conductive in nature, so that even if an electric current is only partially supplied to the first electrode, the first electrode is entirely held at a uniform potential, thereby causing light to be emitted from the entire lower surface of the first electrode.

As stated above, the gallium nitride-based compound semiconductor light emitting device of the invention makes use of a transparent conductive film as the first electrode (light emission electrode). Needless to say, the transparent conductive film is transparent to visible light, making it possible to pick up light from the side of the light emission electrode. This ensures a number of significant effects as follows.

1. The electrode can be mounted as an uppermost layer and can be connected through an ordinary wire bonding method without use of any solder. If a lead wire is spot connected to the first electrode, an electric current can be diffused in parallel directions owing to the conductivity of the first electrode. The uniform potential of the first electrode is ensured. This would possibly narrow a wire bonding pad with respect to the first electrode. This allows the first electrode (light emission electrode) and the second electrode (n-type electrode) to be kept at a distance therebetween sufficient to prevent short-circuiting in device fabrication processes such as photolithography, etching, lift-off and the like.

In the known flip-chip system, the two electrodes should be kept away from each other at a distance much longer than a limited distance created by the lithographic or etching technique so as to prevent short-circuiting between solders for the two electrodes. This in turn prevents the area of the first electrode from being widened.

In the practice of the invention, the ratio of the first electrode area to the total chip area can be increased, resulting in an improvement of the light emission efficiency. The distance between the two electrodes can be made significantly smaller than that selected in a flip-chip system. This leads to a reduction of the electric resistance component of the device.

2. Although the flip-chip system requires a first electrode (light emission electrode) and a second electrode (n-type layer electrode) which have the same pattern, it is possible in the present invention to design an optimum pattern for reducing the electric resistance component of the device owing to an increasing degree of freedom of design of the two electrode patterns.

3. Because of the small distance between the first electrode (light emission electrode) and the second electrode (n-type layer electrode) and the increase in the degree of freedom of design of the electrode pattern, it is possible to miniaturize the chip size relative to the light emission area and enlarge the light emission area, resulting in the economic fabrication of the device.

4. The device of the invention can be assembled into a hybrid unit with other light emission devices such as AlGaAs red light LED, within the same lead frame, making it easy to fabricate a light emission device of multi-colors such as light, green and red colors.

BRIEF DESCRIPTION OF THE DRAWINGS

FIG. 1 is a schematic sectional view showing a chip structure of a light-emitting device according to one embodiment of the invention;

FIG. 2 is a schematic sectional view of a light emitting diode structure using the chip structure;

DETAILED DESCRIPTION OF THE PREFERRED EMBODIMENTS

Figure 4:
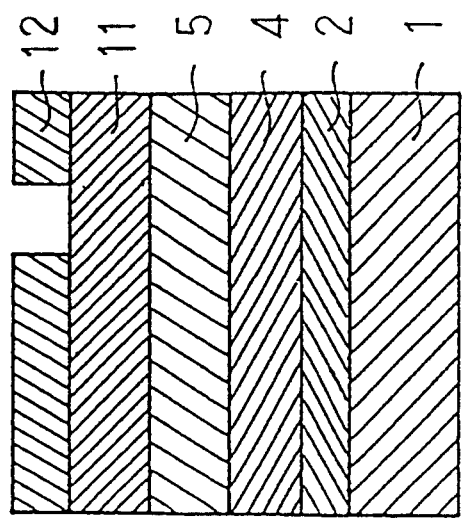
FIGS. 3 to 9 are, respectively, a schematic sectional view showing a fabrication sequence of the light-emitting diode of FIG. 1.

The following specific embodiments of the present invention are described with reference to the accompanying drawings.

FIG. 1 shows a light-emitting diode to which a gallium nitride-based compound semiconductor device of the invention is applied.

A light-emitting diode 10 has a sapphire substrate 1 and a 500 angstrom thick AlN buffer layer 2 formed thereon. An approximately 2.5 $\mu$m thick n-type layer 4 made of n-type GaN is formed on buffer layer 2. In addition, an approximately 0.2 $\mu$m thick i-type layer 5 made of semi-insulating GaN is formed on n-type layer 4. A recess 21 which reaches n-type layer 4 through i-type layer 5 is also formed. A second electrode 8 made of a metal material is formed to fill recess 21 for connection with n-type layer 4.

Further, a first electrode 7 which is kept away from second electrode 8 is formed on i-type layer 5. First electrode 7 is a transparent conductive film made of tin-added indium oxide (hereinafter abbreviated as ITO). First electrode 7 has terminal electrode 9 formed at a corner portion thereof. Terminal electrode 9 is constituted of two layers including an Ni layer 9a and an Au layer 9b. The second electrode 8 is constituted of three layers including an Al layer 8a connected to n-type layer 4, an Ni layer 8b and an Au layer 8c. In this type of light-emitting diode 10, sapphire substrate 1 has an Al reflection film 13 vacuum deposited on the opposite side of the sapphire substrate 1.

Light-emitting diode 10 is mounted on a substrate 40 as shown in FIG. 2 and is electrically connected to lead pins 41, 42 provided vertically to the substrate 40. More particularly, the Au layer 9b of the terminal electrode 9 connected to the first electrode 7 is connected to the lead pin 41 through an Au wire 43. The Au layer 8c of the second electrode 8 and the lead pin 42 are connected to each other through an Au wire 44.

Fabrication of the light-emitting diode as set out hereinabove is described with reference to FIGS. 3 to 9.

The light-emitting diode 10 is fabricated by vapor phase growth according to a metal organic vapor phase epitaxy technique (hereinafter referred to MOVPE).

The gases used include NH$_3$, an H$_2$ carrier gas, trimethyl gallium (Ga(CH$_3$)$_3$) (hereinafter referred to simply as TMG), trimethyl aluminum (Al(CH$_3$)$_3$, hereinafter referred to simply as TMA), silane (SiH$_4$) and diethyl zinc (hereinafter referred to simply as DEZ).

A single crystal sapphire substrate 1 having a surface oriented to the direction (1120), i.e., "a"-surface, subjected to organic washing and thermal treatment, is set on a susceptor which is mounted in a reaction chamber of a MOVPE apparatus.

While passing H$_2$ to the reaction chamber at a flow rate of 2 liters/minute at normal pressures, the sapphire substrate 1 is subjected to vapor phase etching at 1200° C. for 10 minutes.

Thereafter, the temperature is lowered to 400° C., followed by feeding $H_2$ at 20 liters/minute, $NH_3$ at 10 liters/minute and TMA at a rate of $1.8 \times 10^{-5}$ moles/minute to form a AlN buffer layer 2 with a thickness of 500 angstroms.

While keeping the sapphire substrate 1 at a temperature of 1150° C., 20 liters/minute of $H_2$, 10 liters/minute of $NH_3$ and $1.7 \times 10^{-4}$ moles/minute of TMG are fed for 30 minutes to form a 2.5 $\mu$m n-type layer 4 consisting of GaN having a carrier concentration of $1 \times 10^{15}/cm^3$.

The sapphire substrate 1 is then heated to 900° C., followed by feeding 20 liters/minute of $H_2$, 10 liters/minute of $NH_3$, $1.7 \times 10^{-4}$ moles/minute of TMG and $1.5 \times 10^{-4}$ moles/minute of DEZ for two minutes, thereby forming a 0.2 $\mu$m thick i-type layer 5 made of GaN.

Figure 3:
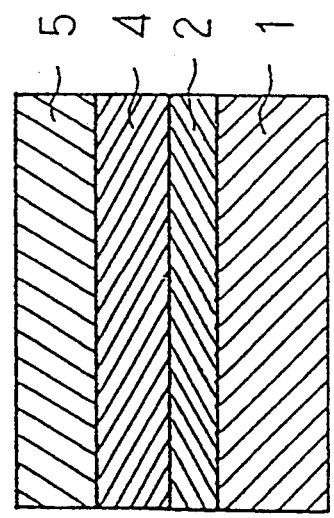

Thus, there is obtained a LED wafer having a multi-layer structure as shown in FIG. 3.

As shown in FIG. 4, a $SiO_2$ layer 11 is formed in a thickness of 1 $\mu$m over the entire upper surface of i-type layer 5 by a sputtering technique. A photoresist 12 is then formed on $SiO_2$ layer 11, followed by photolithography to form an intended pattern such that a portion of photoresist 12, corresponding to a portion where a second electrode 8 is to be formed, is removed.

Figure 5:
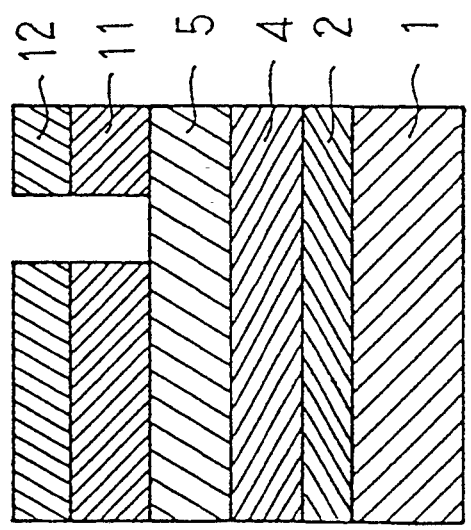

Thereafter, as shown in FIG. 5, the resultant exposed portion of the $SiO_2$ layer 11 is etched by means of a hydrofluoric acid etchant through the mask of the photoresist 12.

Figure 6:
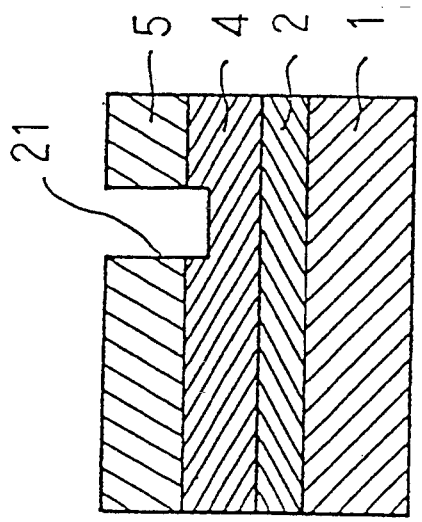

As shown in FIG. 6, a recess 21 which reaches the n-type layer 4 through i-type layer 5 is formed by reactive ion etching through the masks of the photoresist 12 and the $SiO_2$ layer 11 while feeding $CCl_2F_2$ gas at a rate of 10 ml/minute under conditions of a degree of vacuum of 0.04 Torr., and high frequency power of 0.44 $W/cm^2$. After completion of the etching, dry etching with Ar is effected.

The photoresist 12 and the SiO layer 11 are removed by means of hydrofluoric acid.

Subsequently, an approximately 1000 angstrom thick transparent conductive ITO layer is formed over the entire surface by ion plating. A photoresist is applied onto the ITO layer. The photoresist is formed into a desired pattern by photolithography while leaving the photoresist at a portion at which first electrode 7 is to be formed.

Figure 7:
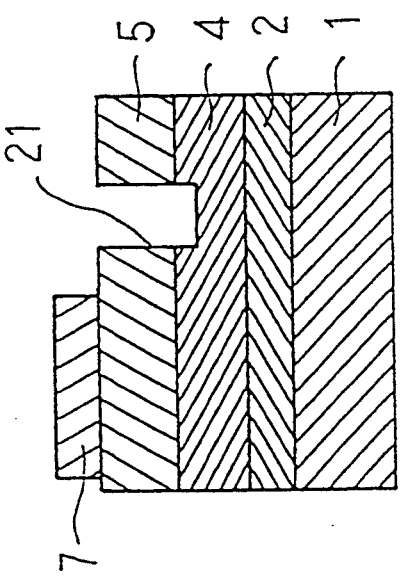

The exposed portion of the ITO layer is etched through the photoresist mask. Thereafter, the photoresist is removed. By this operation, the first electrode consisting of the ITO layer left after the etching is formed as shown in FIG.7.

Subsequently, an Al layer is formed over the entire surface of the sample in a thickness of approximately 2000 angstroms. A photoresist is applied onto the Al layer, followed by photolithography to form an intended pattern of the photoresist so that a portion corresponding to second electrode 8 to be formed is left.

Figure 8:
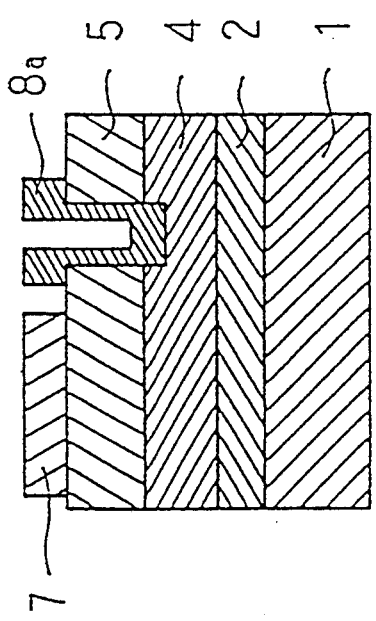

The exposed portion of the Al layer is etched through the photoresist mask, after which the photoresist is removed. By this operation, an Al layer 8a which is used as second electrode 8 for connection to the n-type layer 4 is formed as shown in FIG. 8.

A photoresist is applied over the entire upper surface of the sample, followed by photolithography to remove the photoresist at portions where the terminal electrode 9 for the first electrode 7 made of ITO and the second electrode 8 are to be formed, respectively. As a result, a photoresist layer 31 is formed except for the portions where the terminal electrode 9 and the second electrode 8 are to be formed.

Figure 9:
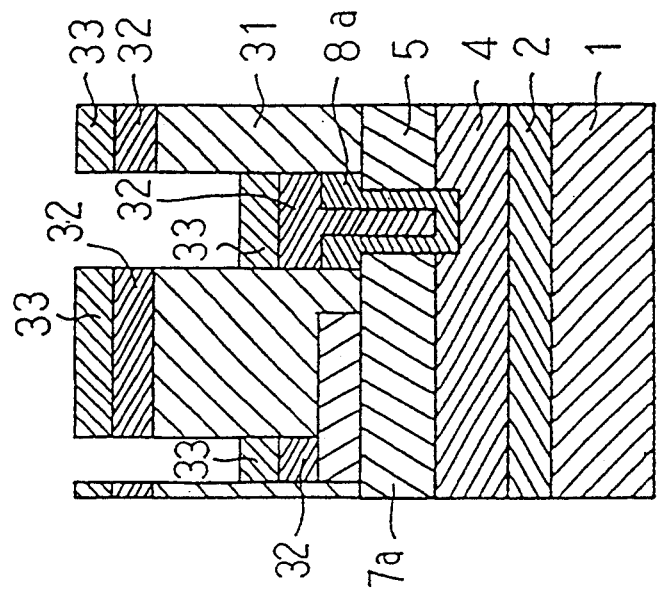

As shown in FIG. 9, a Ni layer 32 and an Au layer 33 are, successively, formed over the entire upper surface of the sample in thicknesses of about 500 angstroms and about 3000 angstroms, respectively.

The photoresist 31 is removed by means of acetone to remove the Ni layer 32 and the Au layer 33 formed on the photoresist 31, thereby forming a Ni layer 9a and an Au layer 9b of the terminal electrode 9 for the first electrode 7 and a Ni layer 8b and an Au layer 8c for the second electrode 8.

As shown in FIG. 1, Al is vacuum deposited on the entire opposite side of the sapphire substrate 1 in a thickness of about 2000 angstroms to form a reflection film 13.

The resultant wafer is diced into individual chips. The LED chip is fixed on a lead frame 40 as shown in FIG. 2. The lead pin 41 and the Au layer 9b of the terminal electrode 9 for the first electrode 7 are connected by Au wire 43. The lead pin 42 and the Au layer 8c of the second electrode 8 are connected by Au wire 44.

In this manner, a light-emitting diode having a MIS (metal-insulator-semiconductor) structure can be fabricated.

When a voltage is applied such that the first transparent conductive electrode 7 becomes positive in potential relative to the second electrode 8, light is emitted at i-type layer 5 provided beneath first electrode 7. The light can be directly picked up through first transparent electrode 7. Moreover, the light reflected from the reflection film 13 formed on the opposite side of the sapphire substrate 1 is obtained through first transparent electrode 7.

This light emitting diode makes use of a transparent conductive film as the first electrode 7. Thus, the area of the first electrode 7 is enlarged. This makes a small series resistance between the first electrode 7 and the second electrode 8, thereby suppressing generation of heat.

This reflects on the current-voltage characteristic in which the threshold Voltage at a current of 10 mA is 6 volts. With a light-emitting diode having a known structure (i.e. LED using an aluminum electrode as the first electrode), the threshold voltage at a current of 10 mA is 8 volts. Thus, the threshold voltage is reduced to about ¾ of that in conventional diodes, thus lowering the drive voltage.

Figure 10:
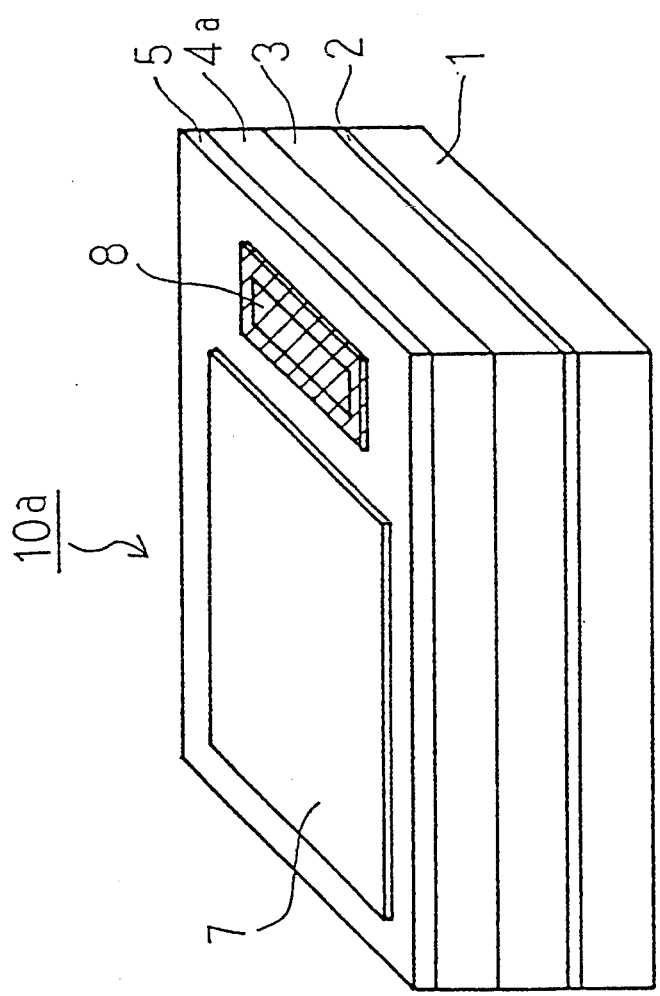
FIG. 10 is a schematic sectional view showing a light-emitting diode according to another embodiment of the invention.

In the light emitting diode 10 of the above embodiment, n-type layer 4 has a single-layer structure. As shown in FIG. 10, a light-emitting diode 10a may have a double-layer n-type structure which includes a 1.5 $\mu$m thick lower carrier concentration n-type layer 4a connected to the i-type layer 5 and a 2.2 $\mu$m thick high carrier concentration n+-type layer 3.

In this light-emitting diode 10a, an electric current passes through the high carrier concentration n+ type layer 3 in a horizontal direction. Thus, the resistance between electrodes can be further reduced.

The high carrier concentration n+-type layer 3 is formed by keeping the temperature of the sapphire substrate at 1150° C. and feeding 20 liters/minute of $H_2$, 10 liters/minute of $NH_3$, $1.7 \times 10^{-4}$ moles/minute of TMG, and 200 ml/minute of silane ($SiH_4$) diluted with $H_2$ to 0.86 ppm for 30 minutes thereby providing a film with a thickness of 2.2 μm and a carrier concentration of $1.5 \times 10^{18}/cm^3$.

Figure 11:
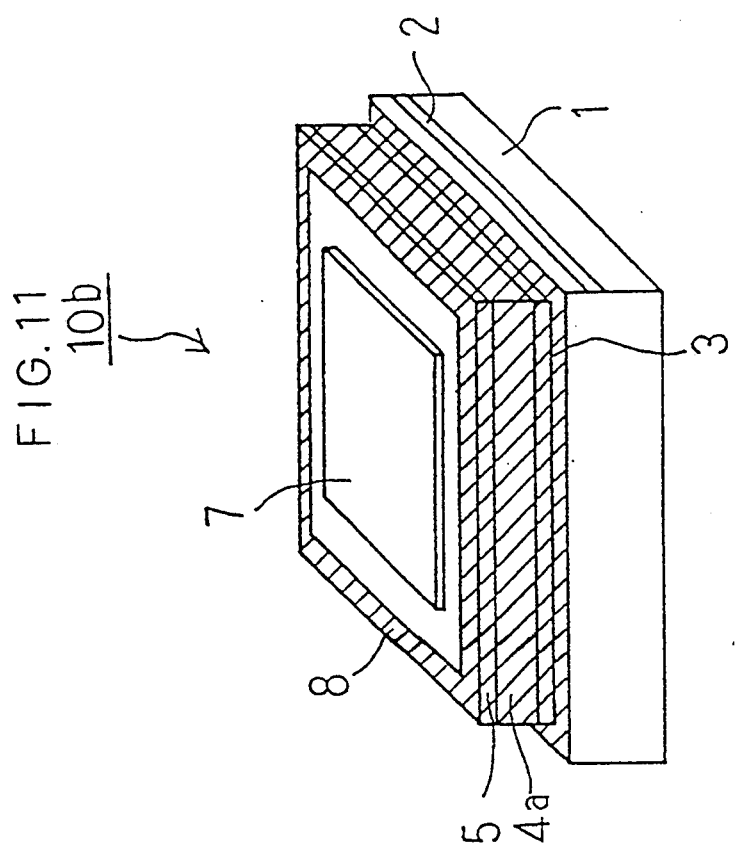
FIG. 11 is a schematic sectional view showing a light-emitting diode according to a further embodiment of the invention.

A further embodiment is shown in FIG. 11, wherein a light-emitting diode 10b includes a first electrode 7 which is provided at the center of the chip and made of a transparent conductive film and a second electrode 8 provided around the first electrode 7 and connected to n+-type layer 3.

In this arrangement, an Al layer which is the lowermost layer of the second electrode 8 may be provided as a reflection layer, resulting in an improvement of light emission efficiency.

The light-emitting diode 10b can be fabricated by the steps shown in FIGS. 12–15.

Figure 12:
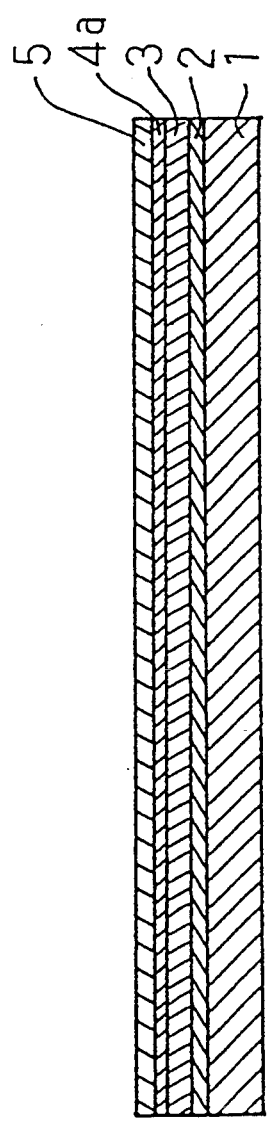
FIGS. 12–15 are, respectively, schematic sectional views of a wafer during the fabrication process of the light-emitting diode of FIG. 11.

As shown in FIG. 12, a AlN buffer layer 2, a high carrier concentration n+-type layer 3, a low carrier concentration n-type layer 4a and an i-type layer 5 are successively formed on a sapphire substrate 1 according to the procedure set out hereinabove.

Figure 13:
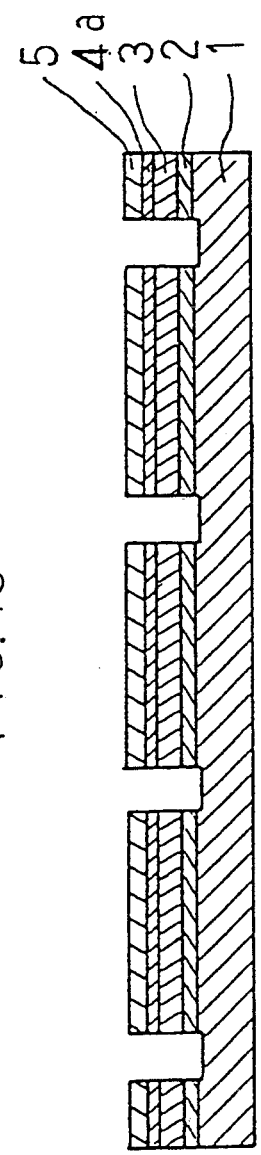

As shown in FIG. 13, the resultant multi-layered wafer is diced by the use of a thick blade having, for example, a thickness of 250 μm, and cross cut to an extent reaching the upper surface of the sapphire substrate 1 from the i-type layer 5 through the lower carrier concentration n-type layer 4a, high carrier concentration n+-type layer 3 and buffer layer 2.

Figure 14:
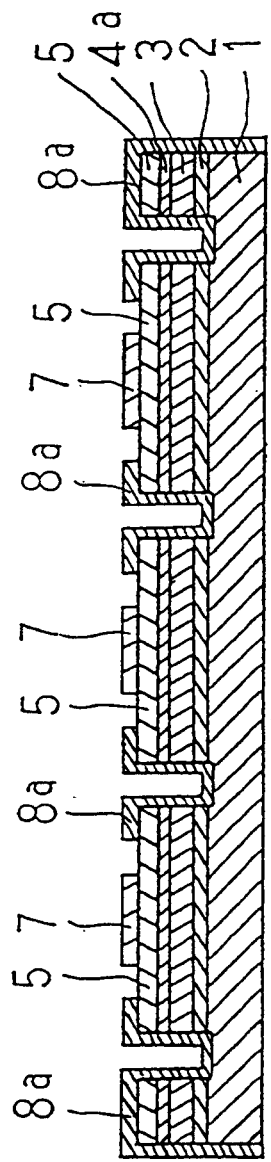

In the same manner as in FIGS. 7 and 8, a first electrode 7 consisting of ITO and a second electrode 8a are formed as shown in FIG. 14.

Figure 15:
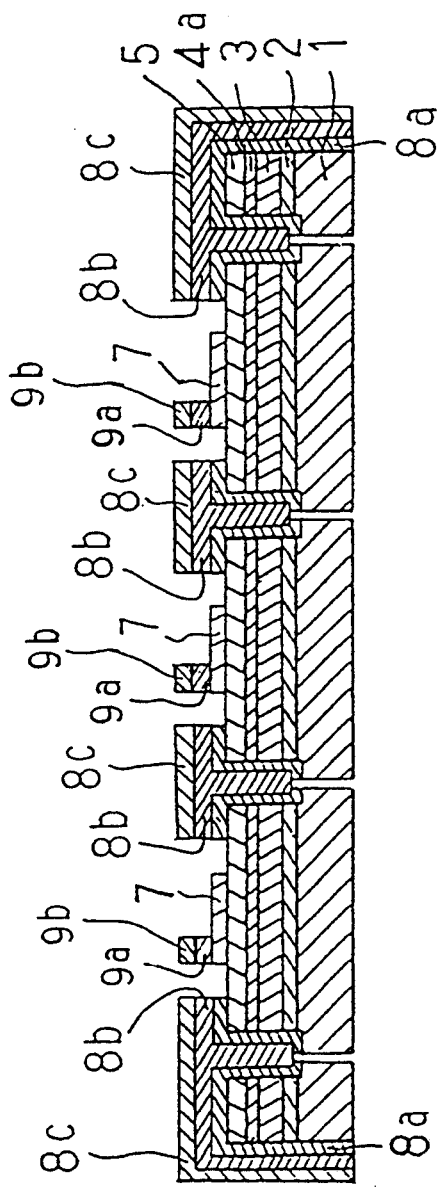

According to the procedure shown in FIG. 9, Ni layer 9a and Au layer 9b of the terminal electrode 9, and Ni layer 8b and Au layer 8c of the second electrode 2 are formed as shown in FIG. 15.

As shown in FIG. 15, the wafer is diced by means of a thin blade having a thickness, for example, of 150 μm to cut off the sapphire substrate 1 into pieces at the half-cut portions where the second electrode 8 has been cross cut.

In this manner a light-emitting diode 10b having such a structure as shown in FIG. 11 is fabricated.

Figure 16:
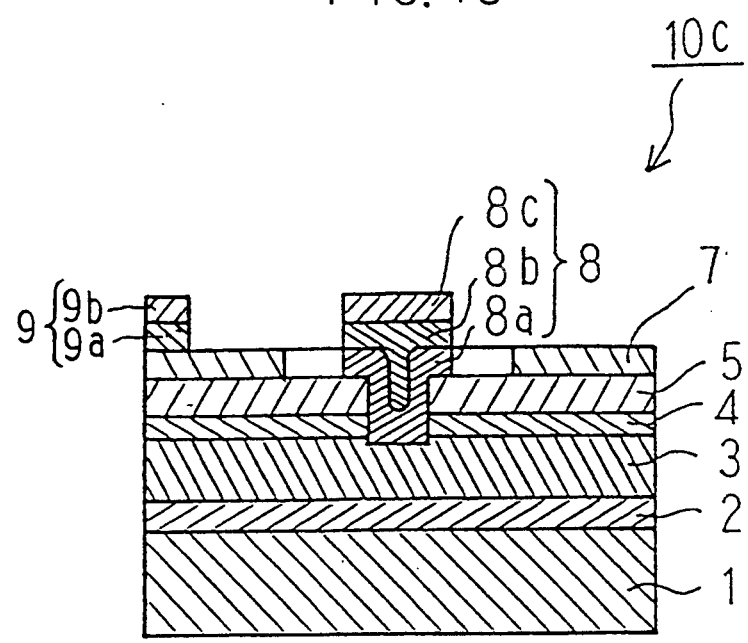
FIG. 16 is a schematic sectional view of a light-emitting diode according to a still further embodiment of the invention.
Figure 17:
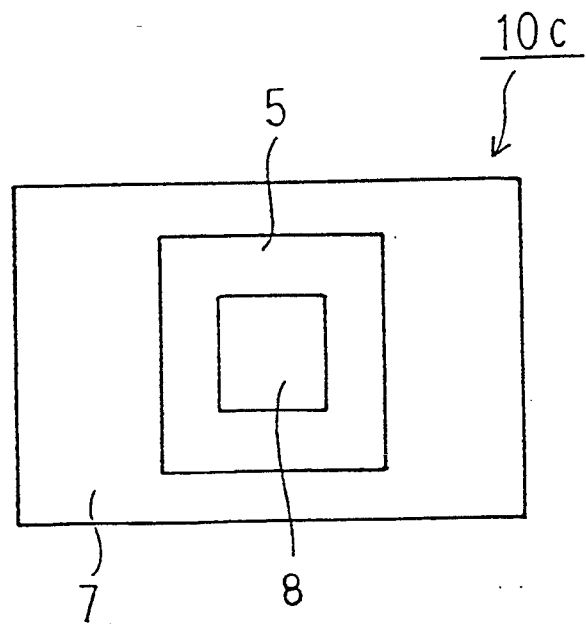
FIG. 17 is a plan view of the light-emitting diode of FIG. 16.

Further, as shown in FIG. 16, a light-emitting diode 10c may be fabricated as follows: a small-size hole which extends to the n+-type is formed at a central portion of i-type layer 5, and a second electrode 8 is formed in the hole, about which a first transparent conductive electrode 7 is formed.

In light-emitting diodes 10b, 10c having such structures as stated hereinabove, second electrode 8 for the high carrier concentration n+-type layer 3 has a symmetric positional relation with first electrode 7 for i-type layer 5.

Accordingly, the electric current passing between these electrodes is substantially uniform irrespective of the position of the i-type layer 5. Accordingly, uniform light emission in the blue light-emitting region of the diodes is ensured with an improved light emission intensity.

While this invention has been described in connection with what is presently considered to be the most practical and preferred embodiments, it is to be understood that the invention is not limited to the disclosed embodiments, but, on the contrary, is intended to cover various modifications and equivalent arrangements included within the spirit and scope of the appended claims.

What is claimed is:

1. A semiconductor light-emitting device which comprises:

an n-type layer made of an n-type gallium nitride-based compound semiconductor of the formula $Al_xGa_{1-x}N$, wherein $0 \leq X < 1$;

an i-type layer formed on the n-type layer and made of a semi-insulating i-type gallium nitride-based compound semiconductor of the formula $Al_xGa_{1-x}N$, wherein $0 \leq X < 1$, and doped with a p-type impurity for junction with the n-type layer;

a first electrode formed on the surface of the i-type layer and made of a transparent conductive film; and a second electrode formed to connect to the n-type layer wherein light is emitted from the side of the i-type layer to the outside, wherein said first electrode is formed at a central portion of said i-type layer and said second electrode is provided around said first electrode and connected to a side wall of said n-type layer.

2. A semiconductor light-emitting device according to claim 1, wherein said second electrode is formed to connect with said n-type layer by making cross-cut grooves from a side of said i-type layer to the surface of said sapphire substrate depending on the chip size of a light-emitting device, and a metal material, filling said grooves and separating said sapphire substrate along said cross-cut grooves.

3. A semiconductor light-emitting device according to claim 1, further comprising a sapphire substrate on which said n-type layer is formed, said sapphire substrate having a reflection layer on a side opposite to said n-type layer.

4. A semiconductor light-emitting device according to claim 3, further comprising a frame substrate to which said reflection layer is connected.

5. A semiconductor light-emitting device according to claim 1, wherein said transparent conductive film consists of tin-added indium oxide (ITO).

6. A semiconductor light-emitting device according to claim 1, further comprising a terminal electrode formed at one corner of said first electrode and having a nickel lowermost layer.

7. A semiconductor light-emitting device according to claim 1, wherein said second electrode has a three layer structure consisting of aluminum, nickel and gold layers formed in this order from a side contacting the n-type layer.

8. A semiconductor light-emitting device according to claim 1, wherein said n-type layer is of double-layer structure including an n-layer of low carrier concentration and an n+-layer of high carrier concentration, the former being adjacent to said i-layer.

9. A semiconductor light-emitting device according to claim 3, further comprising a buffer layer formed on said sapphire substrate.

10. A semiconductor light-emitting device which comprises:

an n-type layer made of an n-type gallium nitride-based compound semiconductor of the formula $Al_xGa_{1-x}N$, wherein $0 \leq X < 1$;

an i-type layer formed on the n-type layer and made of a semi-insulating i-type gallium nitride-based compound semiconductor of the formula $Al_xGa_{1-x}N$, wherein $0 \leq X < 1$, and doped with a p-type impurity for junction with the n-type layer;

a first electrode formed on the surface of the i-type layer and made of a transparent conductive film; and a second electrode formed to connect to the n-type layer through the i-type layer, wherein light is emitted from the side of the i-type layer to the outside, wherein said second electrode is connected to said n-type layer at a central portion of said i-type layer through said i-type layer and said first electrode is formed on said i-type layer around said second electrode and in spaced relation to said second electrode.

11. A semiconductor light-emitting device according to claim 10, further comprising a sapphire substrate on which said n-type layer is formed, said sapphire substrate having a reflection layer on a side opposite to said n-type layer.

12. A semiconductor light-emitting device according to claim 10, further comprising a reflection film and a frame substrate to which said reflection film is connected.

13. A semiconductor light-emitting device according to claim 10, wherein said transparent conductive film of said first electrode consists of tin-added indium oxide (ITO).

14. A semiconductor light-emitting device according to claim 10, further comprising a terminal electrode formed at one corner of said first electrode and having a nickel lowermost layer.

15. A semiconductor light-emitting device according to claim 10, wherein said second electrode has a three layer structure consisting of aluminum, nickel and gold layers formed in that order from a side contacting the n-type layer.

16. A semiconductor light-emitting device according to claim 10, wherein said second electrode is formed to connect with said n-type layer by making a hole which extends through a part of said i-type layer to said n-type layer and filling the hole with a metal material.

17. A semiconductor light-emitting device according to claim 10, wherein said n-type layer is of double-layer structure including an n-layer of low carrier concentration and an $n^+$-layer of high carrier concentration, the former being adjacent to said i-layer.

18. A semiconductor light-emitting device according to claim 10, further comprising a buffer layer formed on said sapphire substrate.

* * * * *